(12) United States Patent
Miyano et al.

(10) Patent No.: US 9,196,349 B2
(45) Date of Patent: Nov. 24, 2015

(54) SEMICONDUCTOR DEVICE

(71) Applicant: Micron Technology, Inc., Boise, ID (US)

(72) Inventors: Kazutaka Miyano, Tokyo (JP); Hiroki Fujisawa, Tokyo (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/341,601

(22) Filed: Jul. 25, 2014

(65) Prior Publication Data

US 2015/0043299 A1    Feb. 12, 2015

(30) Foreign Application Priority Data

Aug. 9, 2013   (JP) ................................. 2013-165856

(51) Int. Cl.
  G11C 8/00      (2006.01)
  G11C 11/4074   (2006.01)
  G11C 7/10      (2006.01)
  G11C 7/22      (2006.01)

(52) U.S. Cl.
  CPC .......... *G11C 11/4074* (2013.01); *G11C 7/1057* (2013.01); *G11C 7/222* (2013.01); *G11C 2207/2227* (2013.01)

(58) Field of Classification Search
  CPC ....... G11C 7/1066; G11C 7/1072; G11C 7/22
  USPC .......................... 365/233.13, 194, 233.5, 233
  See application file for complete search history.

(56) References Cited

U.S. PATENT DOCUMENTS

| 6,266,294 B1 *  | 7/2001  | Yada et al. ............... 365/233.14 |
| 7,688,671 B2    | 3/2010  | Hosoe et al. |
| 8,422,263 B2 *  | 4/2013  | Saito et al. ...................... 365/63 |
| 2007/0126469 A1 * | 6/2007 | Kim et al. ....................... 326/30 |

* cited by examiner

*Primary Examiner* — Connie Yoha
(74) *Attorney, Agent, or Firm* — Dorsey & Whitney LLP

(57) ABSTRACT

A device includes an output circuit, a DLL (Delay Locked Loop) circuit including a first delay line receiving a first clock signal and outputting, in response to receiving the clock signal, a second clock signal supplied to the output circuit, and an ODT (On Die Termination) circuit receiving an ODT activation signal and outputting, in response to receiving the ODT activation signal, an ODT output signal supplied to the output circuit to set the output circuit in a resistance termination state, and the ODT circuit including a second delay line configured to be set by the DLL circuit in an equivalent delay amount that is equivalent to a delay amount of the first delay line, the ODT output signal being, in a first time-period during which the ODT activation signal is in an active state, generated by being conveyed via the second delay line in which the equivalent delay amount has been set.

20 Claims, 8 Drawing Sheets

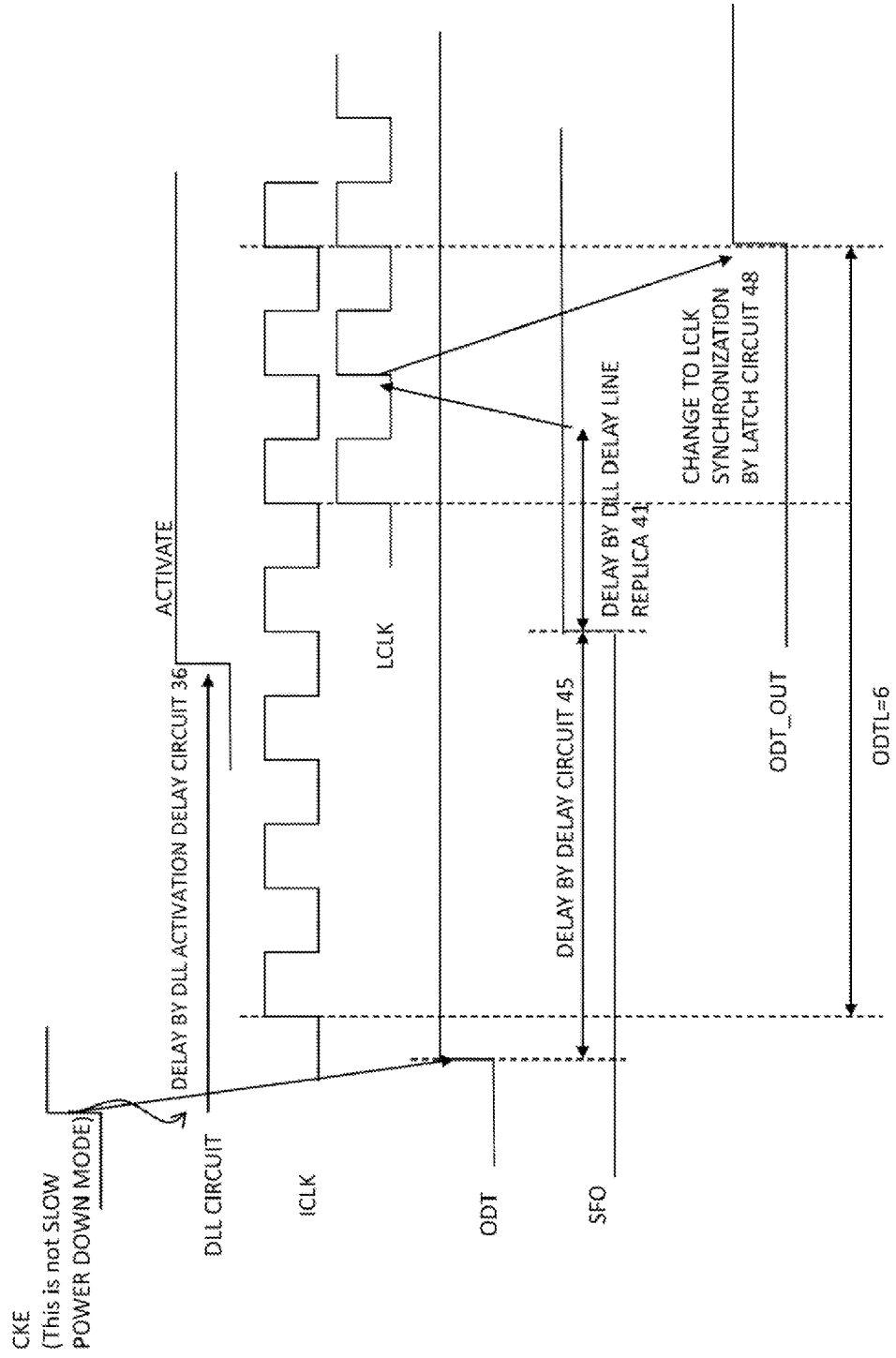

SEMICONDUCTOR DEVICE

REFERENCE TO RELATED APPLICATION

This application is based upon and claims the benefit of priority of Japanese patent application No. 2013-165856, filed on Aug. 9, 2013, disclosure of which is incorporated herein in its entirety by reference thereto.

TECHNICAL FIELD

The present invention relates to a semiconductor device, and in particular to a semiconductor device having an ODT (On Die Termination) function.

BACKGROUND

In semiconductor devices in which a plurality of chips are connected in parallel on an external bus, as in DRAM (Dynamic Random Access Memory), there may be signal reflection by chips with an output buffer in a high impedance state (Hi-Z). Since signal quality in the external bus degrades when this type of signal reflection occurs, in a semiconductor device where a high data transfer rate is required, as in a DDR2 or DDR3 SDRAM (Synchronous DRAM), an ODT function may be provided in which an output circuit functions as a termination resistor.

When an ODT function is provided in a semiconductor device, it is not necessary to provide a termination resistor on a motherboard. As a result, it is possible to reduce the number of parts, and also to prevent signal reflection more effectively, and thus it becomes possible to improve signal quality on the external bus.

ODT operation is turned ON/OFF according to an ODT signal. Here, a period of time from the timing when the ODT signal is activated to the timing when the ODT operation is turned ON is called ODT latency (ODTL). The value of the ODTL is fixed at 2 clock cycles in a DDR2 SDRAM, but is defined as "AL+CWL−2" in a DDR3 SDRAM. This is because if the ODTL value was fixed at 2 clock cycles, turning an ODT operation ON/OFF would not be done in time when the clock cycle would shorten with improvement in clock frequency. Here, "AL" is additive latency, and indicates an advanced input cycle of a column command. "CWL" is column address strobe (CAS) write latency indicating a clock cycle from an input of a write command to an input of write data.

A DLL (Delay Locked Loop) circuit is provided in SDRAM or the like in order to generate a clock signal for timing of data output in synchronization with a clock signal inputted from outside. An ODT operation also is done in synchronization with a clock signal generated by the DLL circuit (Japanese Patent Kokai Publication No. 2007-115366A).

However, a conventional DLL circuit is in an active state when an ODT operation is activated to be performed. As a result power consumption in the conventional DLL circuit increases.

SUMMARY

According to an aspect of the present invention, there is provided a device including an output circuit, a DLL (Delay Locked Loop) circuit including a first delay line receiving a first clock signal and outputting, in response to receiving the first clock signal, a second clock signal supplied to the output circuit, and an ODT (On Die Termination) circuit receiving an ODT activation signal and outputting, in response to receiving the ODT activation signal, an ODT output signal supplied to the output circuit to set the output circuit in a resistance termination state, and the ODT circuit including a second delay line configured to be set by the DLL circuit in an equivalent delay amount that is equivalent to a delay amount of the first delay line, the ODT output signal being, in a first time-period during which the ODT activation signal is in an active state, generated by being conveyed via the second delay line in which the equivalent delay amount has been set.

According to an aspect of the present invention, there is provided a device including an output circuit to be supplied with an ODT (On Die Termination) output signal, a delay circuit configured to be set in a delay amount by an ODT control unit, and a delay line replica circuit configured to be free from being set in a delay amount by the ODT control unit and coupled between the delay circuit and the output circuit, and the ODT output signal being generated by being conveyed via the delay circuit and the delay replica circuit to set the output circuit in a resistance termination state.

According to an aspect of the present invention, there is provided a method including setting a first delay amount of a DLL (Delay Locked Loop) delay line circuit of a DLL circuit when the DLL circuit is activated, and setting a second delay amount of a DLL delay replica circuit when the DLL circuit is activated, and the settings of the first and second delay amounts being concurrent so that the first and second delay amounts are a same as each other.

BRIEF DESCRIPTION OF THE DRAWINGS

FIG. 8 is a diagram illustrating an example of waveforms of respective parts accompanying operation of the DLL circuit and the ODT circuit according to the second exemplary embodiment.

PREFERRED MODES

Figure 1:
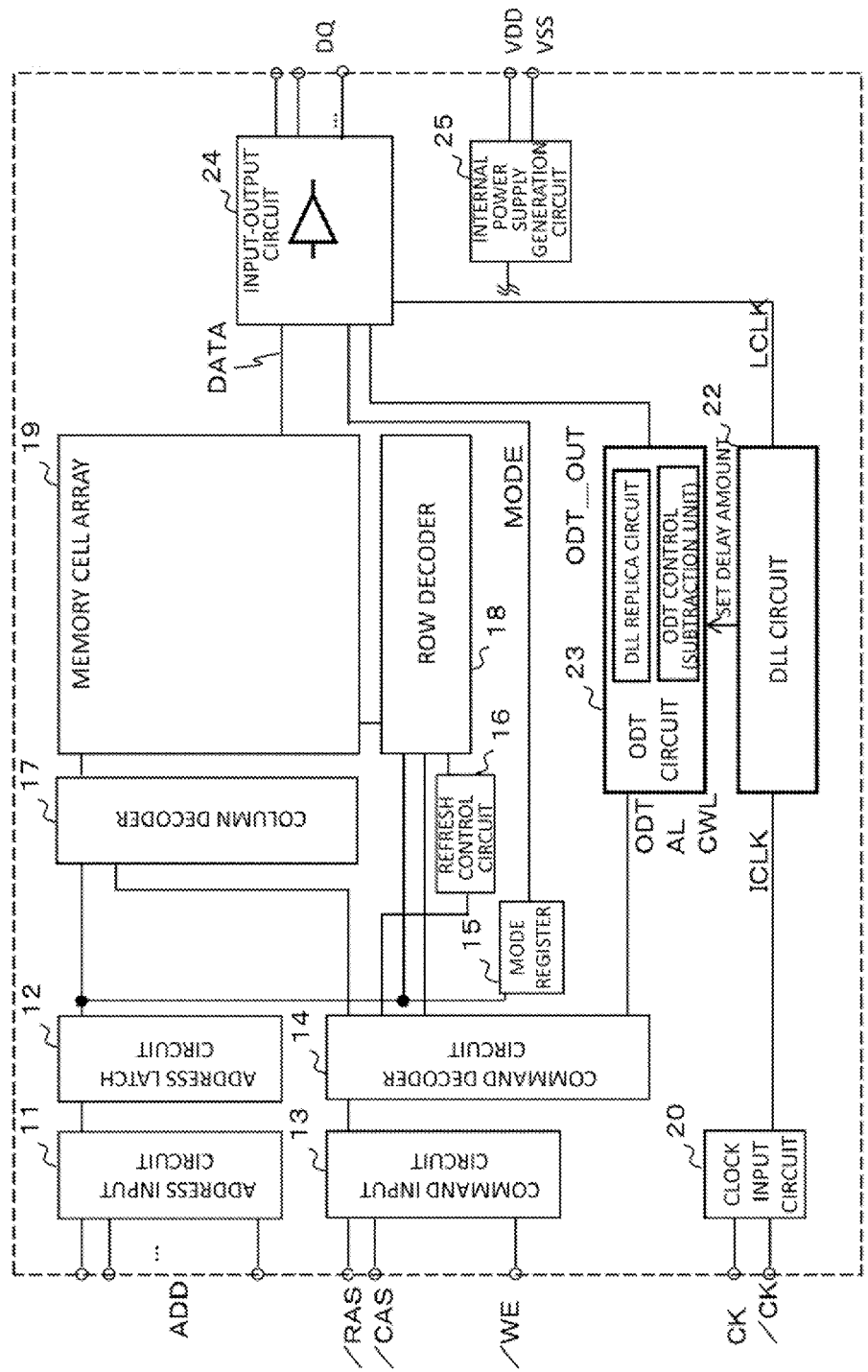
FIG. 1 is a diagram showing an example of a configuration of a semiconductor device according a first exemplary embodiment.

An outline is given below concerning embodiments for implementing the present invention. It is to be noted that reference symbols in the drawings attached to the outline below are examples provided solely in order to aid understanding, and are not intended to limit the invention to modes shown in the drawings.

A device according to an exemplary embodiment of the present invention is provided with: an output circuit; a DLL (Delay Locked Loop) circuit (22 in FIG. 2) comprising a first delay line (corresponding to 31 in FIG. 2) receiving a first clock signal and outputting, in response to receiving the clock signal, a second clock signal supplied to the output circuit; and an ODT (On Die Termination) circuit (23 in FIG. 2) receiving an ODT activation signal and outputting, in response to receiving the ODT activation signal, an ODT output signal supplied to the output circuit to set the output circuit in a resistance termination state, and the ODT circuit comprising a second delay line (corresponding to 41 in FIG. 2) configured to be set by the DLL circuit in an equivalent delay amount that is equivalent to a delay amount of the first delay line, the ODT output signal being, in a first time-period during which the ODT activation signal is in an active state, generated by being conveyed via the second delay line in which the equivalent delay amount has been set.

According to an exemplary embodiment of the present invention, it is possible to perform an ODT operation while having a DLL circuit suitably inactive. Therefore, power consumed by the DLL circuit can be reduced based on the ODT operation according to an exemplary embodiment of the present invention.

A detailed description is given below according to exemplary embodiments, making reference to the drawings.

<First Exemplary Embodiment>

FIG. 1 is a diagram showing a configuration of a semiconductor device according a first exemplary embodiment of the present invention.

In FIG. 1, the semiconductor device is an SDRAM, and is provided with an address input circuit 11, an address latch circuit 12, a command input circuit 13, a command decode circuit 14, a mode register 15, a refresh control circuit 16, a column decoder 17, a row decoder 18, a memory cell array 19, a clock input circuit 20, a DLL circuit 22, an ODT circuit 23, an input-output circuit 24, and an internal power supply generation circuit 25.

The address input circuit 11 receives an address signal ADD from the outside, which is buffered and outputted to the address latch circuit 12. The address latch circuit 12 latches the address signal ADD at timing of a clock signal ICLK, and outputs to the mode register 15, the column decoder 17, and the row decoder 18.

The command input circuit 13 receives a row address strobe signal /RAS, a column address strobe signal /CAS, and a write enable signal /WE from outside, and outputs a command-related signal to the command decode circuit 14. The command decode circuit 14 decodes the command-related signal, outputs decode timing of a column address to the column decoder 17, outputs decode timing of a row address to the row decoder 18, outputs mode setting information to the mode register 15, outputs refresh timing to the refresh control circuit 16, and outputs an ODT signal ODT, additive latency AL, column address strobe write latency CWL to the ODT circuit 23.

The mode register 15 sets a DRAM operation mode matching the mode setting information. For example, a setting is made as to whether the input-output circuit 24 is in an output state (read state) or an input state (write state).

The refresh control circuit 16 controls the row decoder 18 so as to generate a refresh address from the row decoder 18 in accordance with refresh timing.

The column decoder 17 outputs a column address to the memory cell array 19; the row decoder 18 outputs a row address to the memory cell array 19; and the memory cell array 19 accesses a memory cell corresponding to the column address and the row address.

The clock input circuit 20 receives clock signals CK, /CK from outside and performs buffering, and outputs the clock signal ICLK to the address latch circuit 12, the command decode circuit 14, and the DLL circuit 22.

The DLL circuit 22 receives the clock signal ICLK, adjusts the phase of the clock signal ICLK, and outputs a clock signal LCLK to the input-output circuit 24.

Here, the DLL circuit 22 outputs a count value (set value of delay amount) of a counter circuit built into the DLL circuit 22.

The ODT circuit 23 receives the ODT signal ODT, the additive latency AL, and the column address strobe write latency CWL, and outputs an ODT output signal ODT_OUT to have the input-output circuit 24 in a resistance termination state.

Here, the ODT circuit 23 includes a DLL replica circuit to be described later and an ODT control unit (subtraction unit). The DLL replica circuit receives a count value (set value of delay amount) outputted by the DLL circuit 22, and a delay amount is set that is equivalent to the delay amount of a DLL delay line possessed by the DLL circuit. Details are described later.

The input-output circuit 24 outputs write data received from a DQ terminal to the memory cell array 19 in accordance with a mode signal MODE outputted by the mode register 15, or outputs read data received from the memory cell array 19 to the DQ terminal. In this case, the phase of the clock signal LCLK is adjusted to be in synchronization with a data signal outputted from the DQ terminal in synchronization with the clock signal LCLK.

The internal power supply generation circuit 25 is supplied by power supplies VDD, VSS from outside, to generate an internal power supply voltage.

Next, a description is given concerning configuration of the DLL circuit 22 and the ODT circuit 23.

Figure 2:
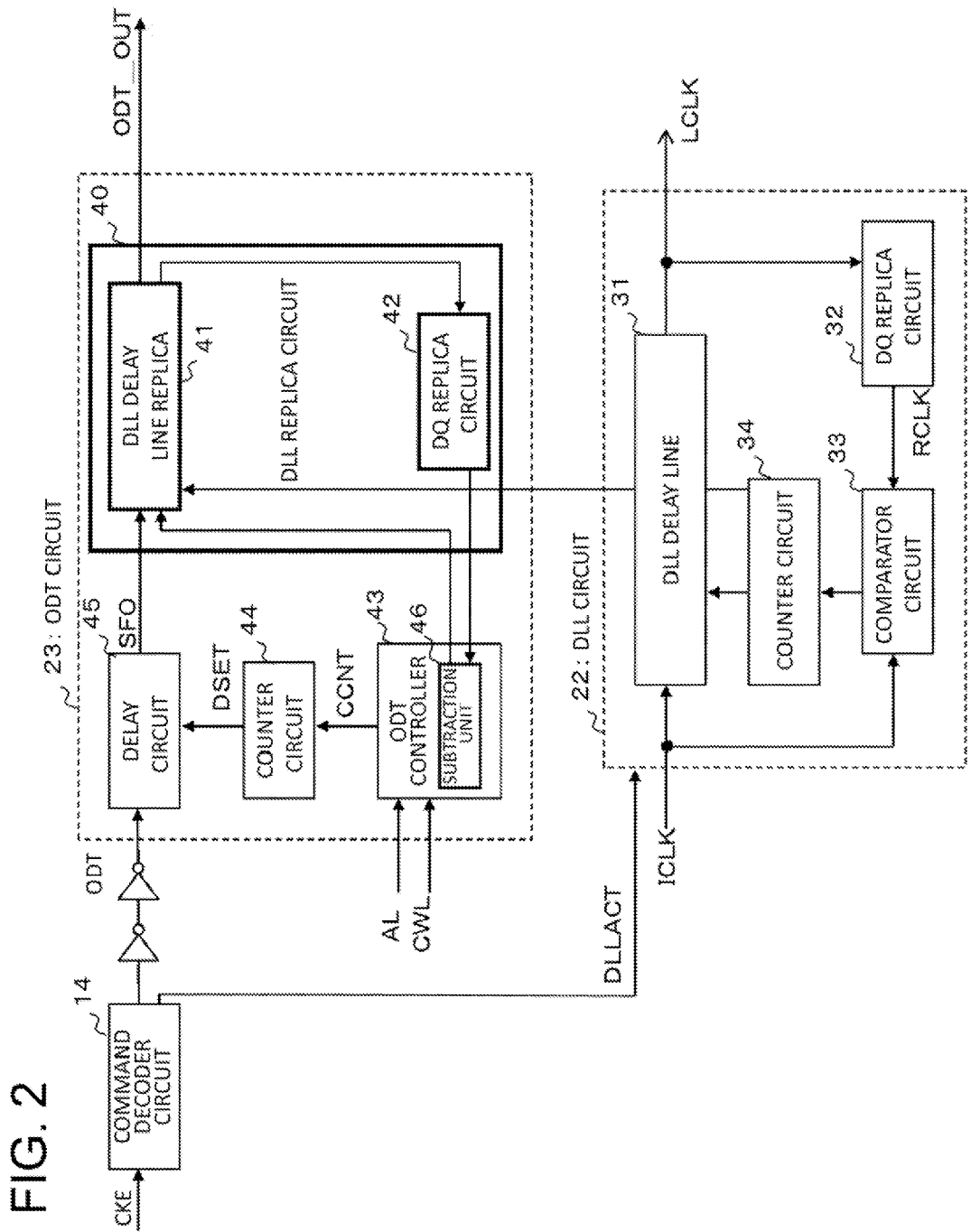
FIG. 2 is a block diagram showing an example of a configuration of a DLL circuit and of an ODT circuit according to the first exemplary embodiment.

FIG. 2 is a block diagram showing a configuration of the DLL circuit and of the ODT circuit according to the first exemplary embodiment of the present invention.

In FIG. 2, the DLL circuit 22 is provided with a DLL delay line 31, a DQ replica circuit 32, a comparator circuit 33, and a counter circuit 34, and is activated by a DLL activation signal DLLACT provided by the command decode circuit 14.

The DLL delay line 31 gives a delay corresponding to a count value outputted by the counter circuit 34 to the clock signal ICLK, to be outputted to the input-output circuit 24 and the DQ replica circuit 32 as the clock signal LCLK.

The DQ replica circuit 32 gives a delay time substantively equivalent to the delay time for the input-output circuit 24 to the clock signal LCLK in order to match timing of data output of the input-output circuit 24 with an external clock, and outputs to the comparator circuit 33 as a clock signal RCLK.

The comparator circuit 33 compares phases of the clock signal ICLK and the clock signal RCLK, and outputs a comparison result to the counter circuit 34.

The counter circuit 34 counts the comparison results and outputs a count value to the DLL delay line 31. That is, using a detection result as to whether the phase of the clock signal ICLK is advanced or delayed with respect to the phase of the clock signal RCLK, by the count value of the counter circuit 34 being updated (+count or −count), the number of delay stages of the DLL delay line 31 is changed (delay amount increase or decrease). It is to be noted that, where the DLL activation signal DLLACT indicates inactivation, the counter circuit 34 continues to hold a counter value of the point in time of the last activation state.

The ODT circuit 23 is provided with a DLL replica circuit 40, an ODT control unit 43, a counter circuit 44, and a delay circuit 45.

The DLL replica circuit 40 includes a DLL delay line replica 41 and a DQ replica circuit 42, and the ODT control unit 43 includes a subtraction unit 46.

The delay circuit 45 receives the ODT signal ODT, gives a delay amount corresponding to a delay set signal DSET outputted by the counter circuit 44 to the ODT signal ODT, and outputs a shift output signal SFO to the DLL delay line replica 41.

The DLL delay line replica 41 provides the shift output signal SFO with a delay corresponding to the count value outputted by the counter circuit 34, and thus outputs the ODT output signal ODT_OUT to the input-output circuit 24 as well as outputting the ODT output signal ODT_OUT to the DQ replica circuit 42.

The DQ replica circuit 42 gives a delay time the same as the delay time of the DQ replica circuit 32 to the received ODT output signal ODT_OUT and outputs to the subtraction unit 46.

The subtraction unit 46 obtains the total delay time T of the DLL delay line replica 41 and the DQ replica circuit 42 by a pulse signal for delay time measurement.

The ODT control unit 43 receives the additive latency AL and the column address strobe write latency CWL from the command decode circuit 14, obtains AL+CWL−2−T, and outputs a counter control signal CCNT to the counter circuit 44.

The counter circuit 44 sets the delay set signal DSET in the delay circuit 45, based on the counter control signal CCNT.

(Operation of Obtaining Value of Delay Time T)

Next, a description is given concerning operation of the DLL circuit 22 and the ODT circuit 23 as in the abovementioned configuration.

Figure 3:
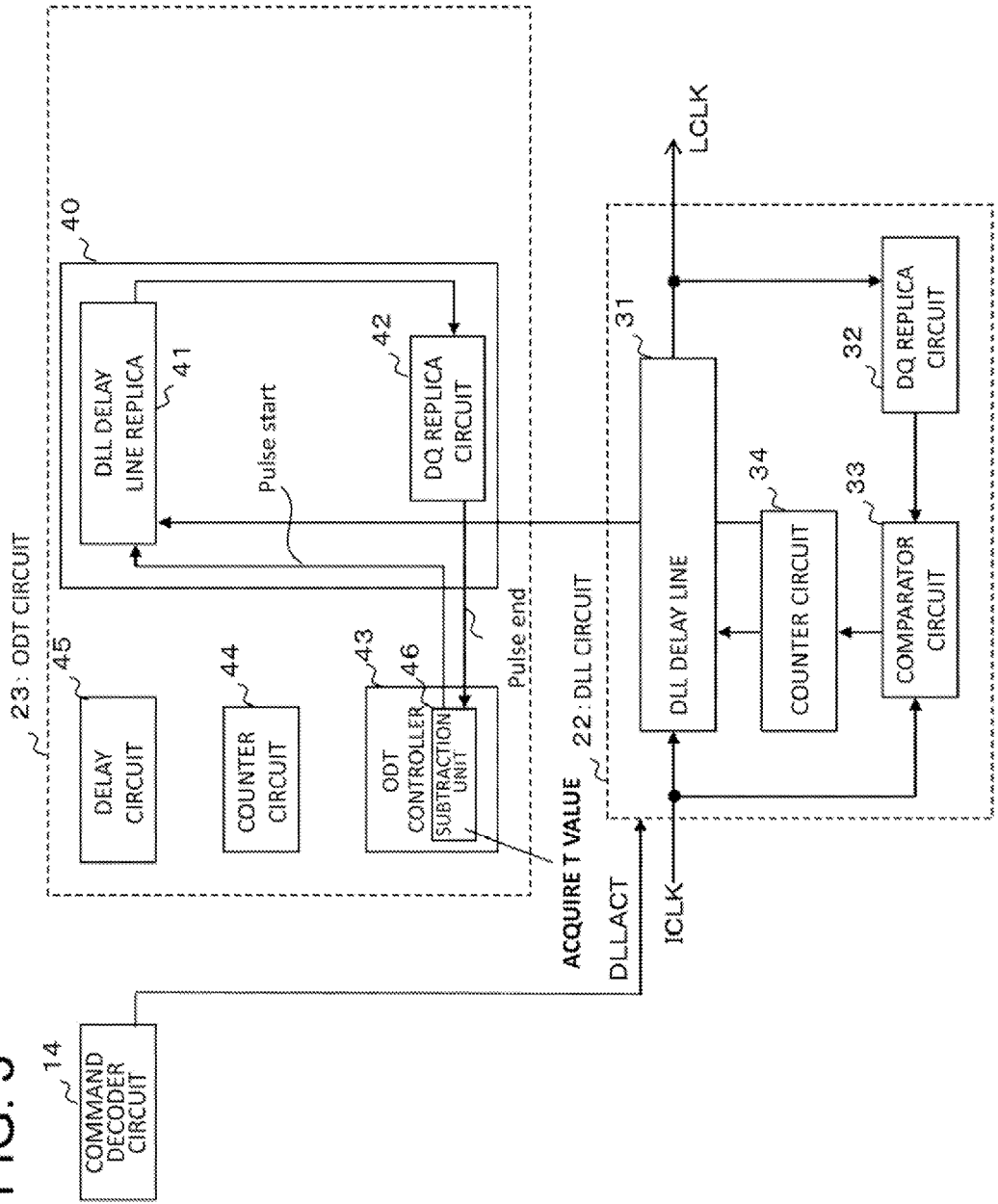
FIG. 3 is a diagram illustrating an example of an operation in a case where a subtraction unit obtains delay time T.

FIG. 3 is a diagram illustrating an example of an operation in a case where the subtraction unit 46 in FIG. 2 obtains delay time T; display of signals and blocks not related to obtaining the delay time T are omitted.

The DLL circuit 22 is in an activated state due to the DLL activation signal DLLACT. The counter circuit 34 has a value such that the phase of the clock signal ICLK matches the phase of the clock signal RCLK, and this value is given to the DLL delay line 31 and the DLL delay line replica 41. In this state, the subtraction unit 46 sends out a pulse signal for delay time measurement via the DLL delay line replica 41 and the DQ replica circuit 42, receives a return pulse signal, and obtains the total detail time T of the DLL delay line replica 41 and the DQ replica circuit 42. It is to be noted that the value of T is a value representing the cycle number of the clock signal ICLK.

This type of operation to obtain the value of the delay time T must be carried out before an ODT output operation. Accordingly, it is desirable that an operation of a DRAM product (for example, DDR3) be carried out with a DLL lock time-period (tDLLK=512 CLK). That is, an operation of obtaining the T value described above is desirably carried out in parallel with a DLL lock operation (an operation in which phase difference between internal clock and external clock is corrected and clock synchronization performed). The configurations of the DLL circuit 22 and of the ODT circuit 23 may be configurations that execute the following type of operation. After turning ON a power supply, in response to a DLL lock operation being initially generated, an operation of obtaining the T value occurs and the T value is obtained. The T value once obtained is held in the subtraction unit 46 within the ODT control unit 43 and continues to be used in ODT operations until the power supply is turned OFF. The T value held in the subtraction unit 46 is erased when the power supply is turned OFF. When the power supply is turned ON again and a DLL lock operation is started, in response to this start, an operation of obtaining the T value is again commenced.

(Operation when Output Signal ODT_OUT is Outputted)

Next, a description is given of operations when an ODT output signal ODT_OUT of the ODT circuit 23 is outputted.

Figure 4:
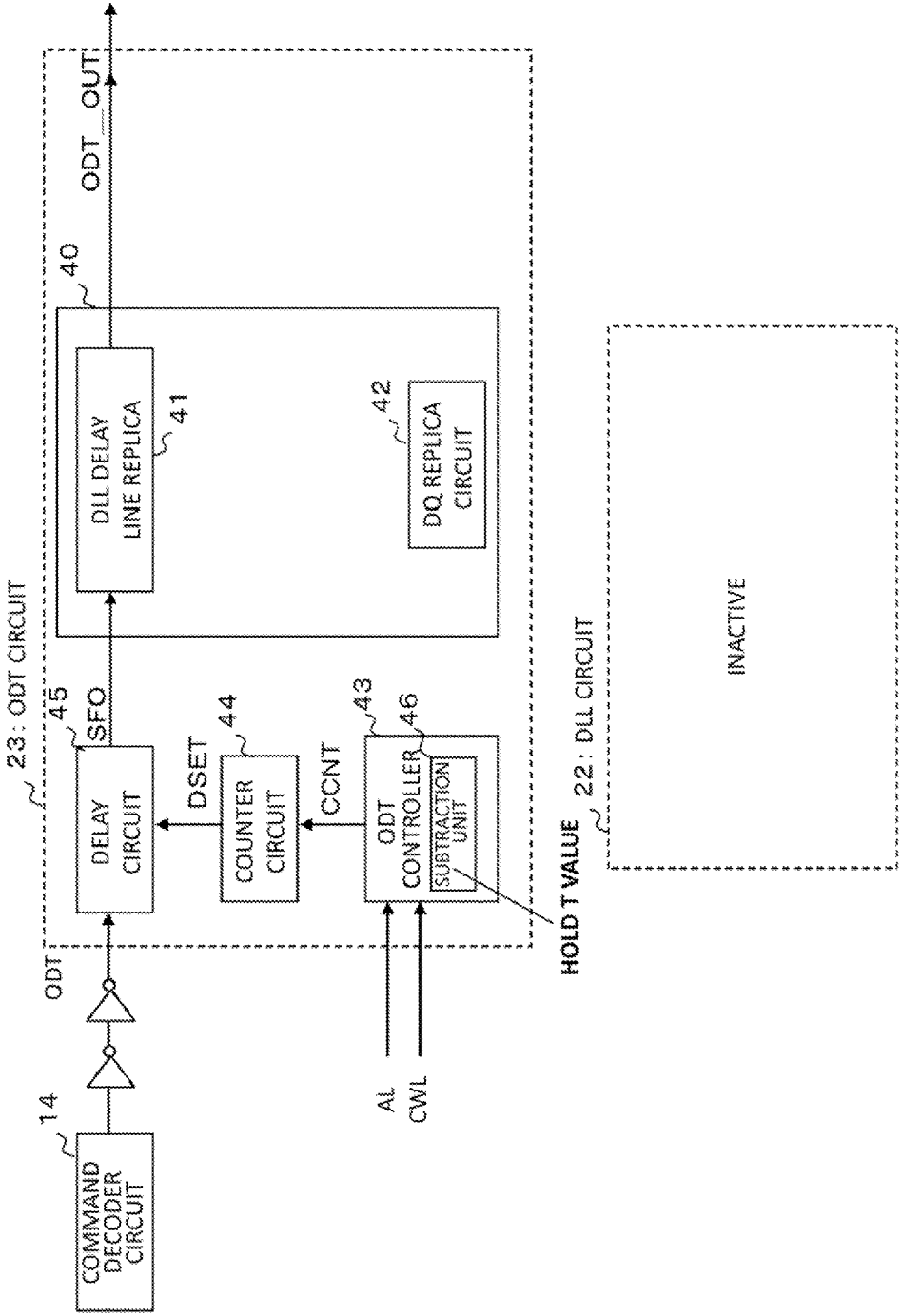
FIG. 4 is a diagram illustrating an operation in a case where an ODT circuit outputs an ODT output signal ODT_OUT.

FIG. 4 is a diagram illustrating an example of an operation in a case where the ODT circuit 23 outputs an ODT output signal ODT_OUT. Displays of signals and blocks not related to this operation are omitted.

The ODT control unit 43 receives the additive latency AL and the column address strobe write latency CWL from the command decode circuit 14, obtains AL+CWL−2−T, and outputs a counter control signal CCNT to the counter circuit 44.

Here, the subtraction unit 46 has a configuration whereby the delay time T obtained as described above is subtracted from the value of AL+CWL−2 (the value of ODTL) defined in the DDR3 SDRAM. By this configuration, the ODT control unit 43 calculates the value of AL+CWL−2−T.

The counter circuit 44 sets the delay set signal DSET in the delay circuit 45, based on the counter control signal CCNT.

The delay circuit 45 receives the ODT signal ODT, gives a delay amount corresponding to a delay set signal DSET outputted by the counter circuit 44 to the ODT signal ODT, and outputs a shift output signal SFO to the DLL delay line replica 41.

The DLL delay line replica 41 provides the shift output signal SFO with a delay corresponding to the count value held by the counter circuit 34, and thus outputs the ODT output signal ODT_OUT to the input-output circuit 24.

(Signal Waveform Diagram)

Next, a description is given concerning waveforms of respective parts of the DLL circuit 22 and the ODT circuit 23.

Figure 5:
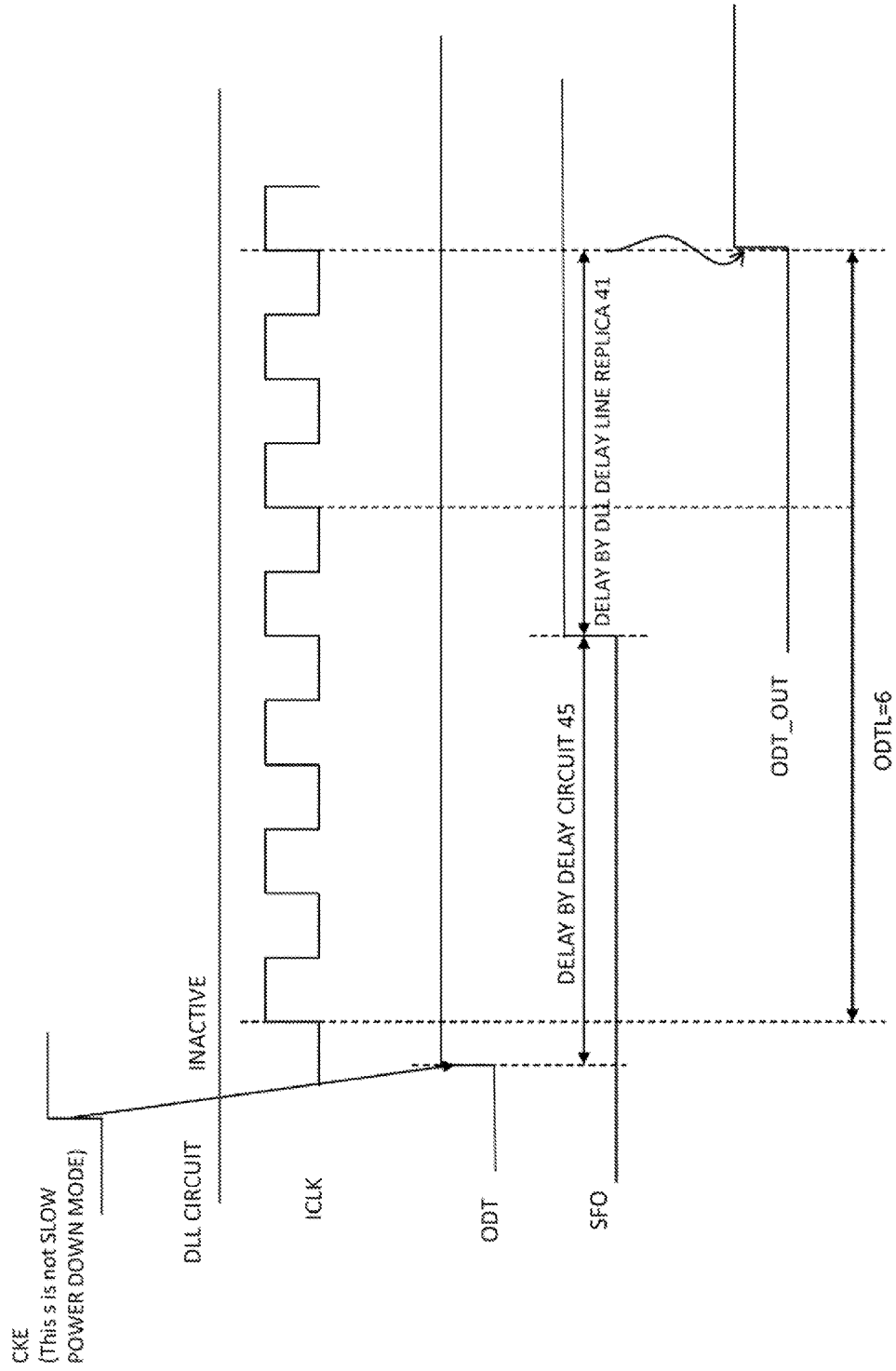
FIG. 5 is a diagram illustrating an example of waveforms of respective parts accompanying operation of the DLL circuit and the ODT circuit according to the first exemplary embodiment.

FIG. 5 is a diagram illustrating waveforms of respective parts accompanying operation of the DLL circuit 22 and the ODT circuit 23.

A clock enable signal CKE, in slow power down mode, is inactive (L level), and outside of the slow power down mode, is active (H level).

Outside of the slow power down mode, when the clock enable signal CKE is active (H level), the command decode circuit 14 has the ODT signal ODT at a high level. The delay circuit 45 gives a delay amount (AL+CWL−2−T) corresponding to a delay set signal DSET outputted by the counter circuit 44 to the ODT signal ODT, and outputs a shift output signal SFO to the DLL delay line replica 41.

In the DLL delay line replica 41, a prescribed delay amount is set according to a count value (set value of the delay amount) outputted by the DLL circuit. Accordingly, the DLL delay line replica 41 gives a delay corresponding to the count value held by the counter circuit 34, to the shift output signal SFO, and outputs the ODT output signal ODT_OUT to the input-output circuit 24.

For example, where AL=3 and CWL=5, the ODT output signal ODT_OUT has a H level at a point in time when the ODT signal ODT goes to a H level, and after 6 clocks (=3+5−2) from a rising edge of the first clock signal ICLK, namely after 6tCK (note that tCK is one cyclic period of the clock signal ICLK).

In a case of operating as above, the DLL circuit 22 is in an inactive state, and power consumption accompanying operation of the DLL circuit 22 is reduced.

The first exemplary embodiment has a configuration where it is possible to set a termination resistance by the ODT output signal, while the DLL circuit is in an inactive state. Accordingly, with the DLL in an inactive state (for example, a DRAM device is in a slow power down mode), when a command to have ODT turned ON is given by a controller, the DLL need not be activated and power consumption is efficient. On the other hand, when the DLL circuit is in an active state, even if a command to have ODT turned ON is given by the controller, there is no problem with regard to operation.

As one comparative example of ODT operation using the DLL circuit in an active state, a configuration (called comparative example (i)) may be considered in which the ODT circuit receives an output clock LCLK of the DLL circuit that is in an active state, and a FIFO circuit positioned at an output stage of the ODT circuit outputs an ODT output signal ODT_OUT in synchronization with the received output clock LCLK. However, since the DLL circuit of this comparative example is not in an inactive state, power consumption increases. Here, the output clock LCLK is outputted via a delay line in which a delay amount provided by the DLL circuit is set. In the first exemplary embodiment, ODT output is performed with the DLL in an inactive state, but on account of this, the delay amount provided by the DLL circuit must be included in the ODT output signal ODT_OUT by another means instead of the delay line of the DLL circuit. This role is taken by the DLL replica circuit 40 and in particular the DLL delay line replica 41.

As another comparative example of ODT operation using the DLL circuit in an inactive state, a configuration (called comparative example (ii)) may be considered in which the delay amount is included in the ODT output signal ODT_OUT by using switch-connecting and going via only the DLL delay line 31 as a portion of the ODT circuit while having remaining portions of the DLL circuit in an inactive state, but with regard to operation margin (or specification margin) this configuration is not advantageous, and the configuration of the first exemplary embodiment is preferable.

As still another comparative example of ODT operation using the DLL circuit that is in an inactive state, a configuration (called comparative example (iii)) may be considered in which an ODT signal received by a DRAM chip is delayed by a fixed delay within the chip as it is, without considering synchronization with an internal clock signal (that is, the DLL circuit may be in an inactive state), and thus the ODT output signal ODT_OUT becomes asynchronous (e.g. out of synchronization). Due to not being in synchronization, the delay is required to be sufficiently long in this configuration from a design viewpoint. As a result, since it may be necessary to wait a sufficient time before inputting a subsequent command, the controller may not be adequate for high speeds. In the configuration of the first exemplary embodiment, the DLL circuit is in an inactive state, but since the DLL replica circuit 40 (DLL delay line replica 41) is provided, in which a delay amount equivalent to that of the delay line of the DLL circuit is set, there is no unnecessary delay amount, and a more accurate delay amount is set. The controller has a configuration in which there is no unnecessary time wait, and it is possible to set the ODTL in a comparatively short time.

In the above description, the first exemplary embodiment, comparative example (i) and comparative example (ii) may be considered to relate to synchronous mode, and comparative example (iii) may be considered to relate to asynchronous mode. Here, use of asynchronous/synchronous modes is distinguished in a DRAM product (in particular, a DDR3 specification), but in general it is known that, outside of electrical current consumption, synchronous mode is superior to asynchronous mode in performance. As a result, curtailing of electrical current consumption is particularly desired in synchronous mode. By using configurations of the respective first and second exemplary embodiments of the present invention, it is possible to curtail electrical current consumption with regard to synchronous mode.

<Second Exemplary Embodiment>

Figure 6:
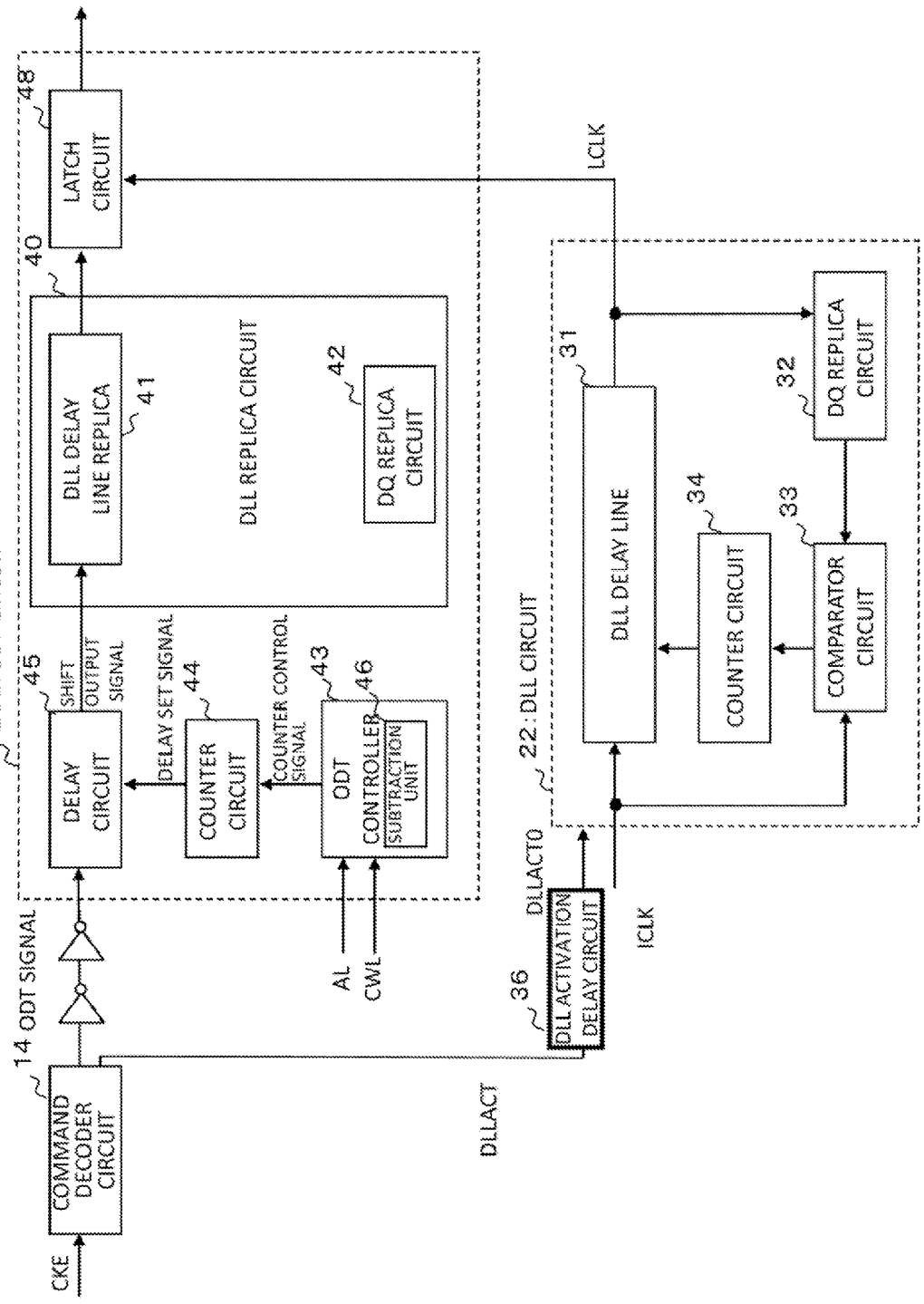
FIG. 6 is a block diagram showing configurations of the DLL circuit and the ODT circuit according to a second exemplary embodiment.

FIG. 6 is a block diagram showing an example of a configuration of a DLL circuit and an ODT circuit according to a second exemplary embodiment of the invention.

In FIG. 6, reference symbols that are the same as in FIG. 2 represent the same objects, and descriptions thereof are omitted. The DLL circuit and the ODT circuit related to the present exemplary embodiment, in contrast to FIG. 2, have a DLL activation delay circuit 36 added, and the ODT circuit 23a further includes a latch circuit 48.

The DLL activation delay circuit 36 delays a DLL activation signal DLLACT outputted by a command decode circuit 14, and outputs a DLL delay activation signal DLLACT0 to the DLL circuit 22.

The latch circuit 48 latches an output signal of a DLL delay line replica 41 by a clock signal LCLK, and outputs an ODT output signal ODT_OUT.

Figure 7:
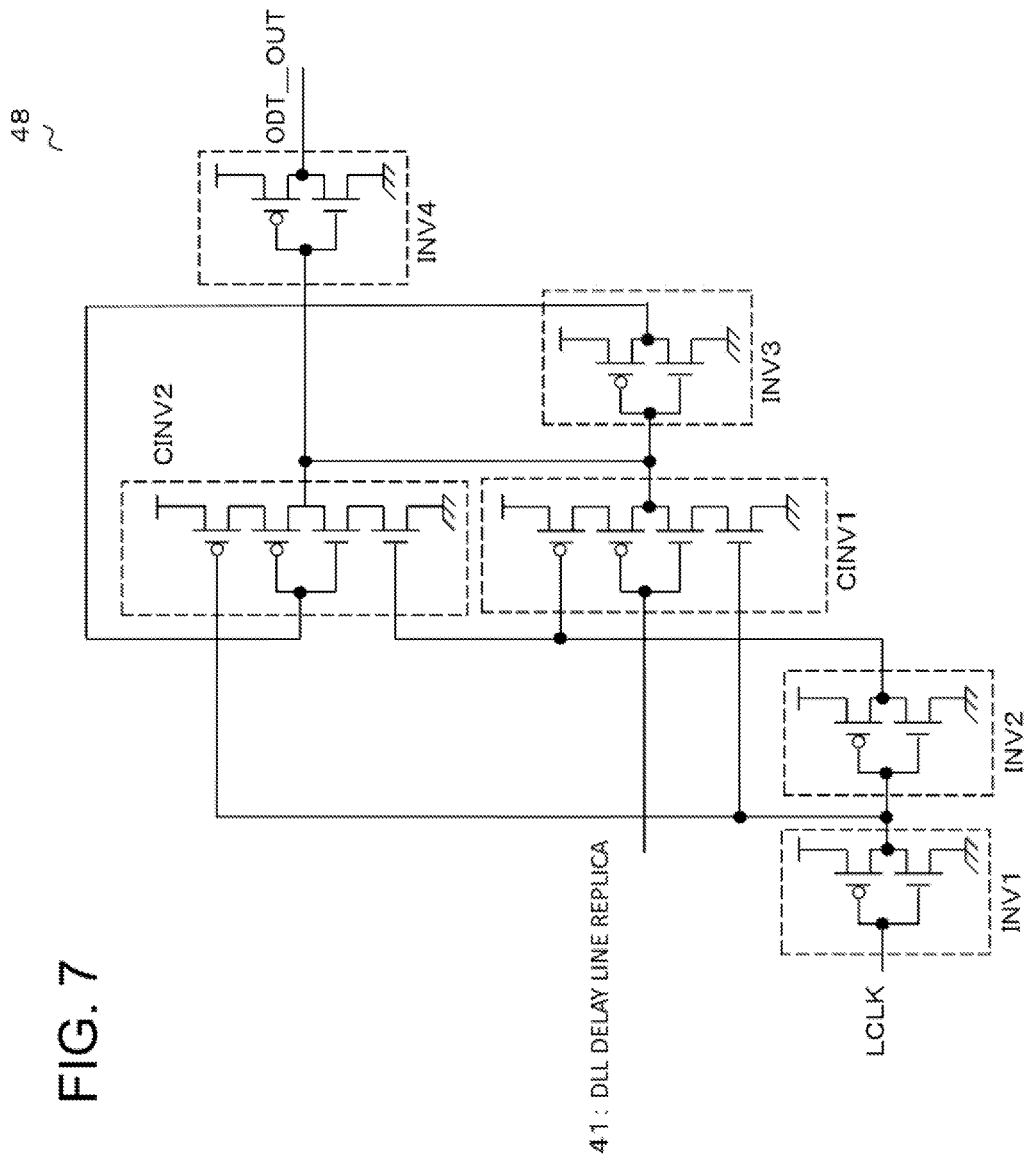
FIG. 7 is an example of a circuit diagram of a latch circuit according to the second exemplary embodiment.

FIG. 7 is an example of a circuit diagram of the latch circuit 48. The latch circuit 48 is configured by a CMOS circuit, and is provided with inverter circuits INV1 to INV4, and clocked inverter circuits CINV1, CINV2.

The inverter circuit INV1 inverts the clock signal LCLK and outputs to the inverter circuit INV2, and a clock control terminal of the clocked inverter circuit CINV1 and a clock inversion control terminal of the clocked inverter circuit CINV2.

The inverter circuit INV2 inverts an inverted signal of the clock signal LCLK and outputs to a clock inversion control terminal of the clocked inverter circuit CINV1, and a clock control terminal of the clocked inverter circuit CINV2.

The clocked inverter circuit CINV1 inverts an output signal of the DLL delay line replica 41 and outputs to the inverter circuits INV3, INV4.

The clocked inverter circuit CINV2 inverts an output signal of the inverter circuit INV3 and outputs to the inverter circuits INV3, INV4.

The inverter circuit INV4 inverts an output signal of an activated side among either of the clocked inverter circuits CINV1 and CINV2 and outputs an ODT output signal ODT_OUT.

In the latch circuit 48 of the above type of configuration, where the clock signal LCLK has an L level, the clocked inverter circuit CINV1 is activated, and the clocked inverter circuit CINV2 is inactivated. Accordingly, an output signal of the DLL delay line replica 41 is inverted by the clocked inverter circuit CINV1, and received by the inverter circuits INV3 and INV4, and a signal with a phase the same as the output signal of the DLL delay line replica 41 is given to an input terminal of the clocked inverter circuit CINV2.

Where the clock signal LCLK has an H level, the clocked inverter circuit CINV1 is inactivated, and the clocked inverter circuit CINV2 is activated. Accordingly, the signal given to the input terminal of the clocked inverter circuit CINV2 is inverted, and received by the inverter circuits INV3 and INV4, and a latch function is realized by the inverter circuit INV3 and the clocked inverter circuit CINV2.

(Signal Waveform Diagram)

Next, a description is given concerning waveforms of respective parts of the DLL circuit 22 and the ODT circuit 23a.

FIG. 8 is a diagram illustrating an example of waveforms of respective parts accompanying operation of the DLL circuit 22 and the ODT circuit 23a. FIG. 8 differs from FIG. 5 in the following 2 points.

(1) When a clock enable signal CKE is active (H level), the DLL circuit 22 is activated after a delay time by the DLL activation delay circuit 36.

(2) The latch circuit 48 latches an output signal of the DLL delay line replica 41 at a rising edge of the clock signal LCLK, and outputs an ODT output signal ODT_OUT to an input-output circuit 24.

According to the DLL circuit 22 and the ODT circuit 23a as described above, the DLL circuit 22 is in an inactive state until an appropriate time. Therefore, power consumption accompanying operation of the DLL circuit 22 is reduced. Since output timing of the ODT output signal ODT_OUT is recovered by the latch circuit 48, accuracy of output timing of the ODT output signal ODT_OUT is improved.

In general, with a high speed DLL circuit and input-output circuit where the time period from the timing when an LCLK clocking operation starts to the timing when the LCLK clocking is used in output (LCLK adjustment time) can be relatively short, it is not necessary to activate the DLL circuit before ODT operation, and even if activation is performed after some delay, synchronous timing of the ODT output is feasible. In such a case the second exemplary embodiment is effective. It is to be noted that the larger the delay amount of the DLL activation delay circuit 36, the more the activation timing of the DLL circuit can be delayed, which is advantageous from the viewpoint of power consumption, but on the other hand, in order that output timing by a latch circuit is suitable in a case assuming a maximum value of the LCLK adjustment time, since it is necessary that the adjustment be sufficiently small and that the DLL circuit be activated in advance, giving consideration to such tradeoffs, the delay amount may be adjusted.

In one example, a switching configuration of selecting, based on a result of calculating (AL+CWL−2−T), one of the configuration of the second exemplary embodiment such as the latch circuit 48 last and another configuration of the first exemplary embodiment may be proposed. For example, in a case of high tCK where there is some leeway in the number of clocks until output (a case where AL+CWL is large), timing by the clock signal LCLK is recovered and accuracy of output timing is raised, as shown in the second embodiment. On the other hand, in a case of low tCK where there is no leeway in the number of clocks (a case where AL+CWL is small), the configuration performs output without change, as shown in the first embodiment. By this switching configuration, it is possible to have operation with leeway in timing with a wide change area for tCK and CWL.

It is to be noted that the disclosure of the abovementioned Patent Literature is incorporated herein by reference thereto. Modifications and adjustments of exemplary embodiments and examples may be made within the bounds of the entire disclosure (including the scope of the claims) of the present invention, and also based on fundamental technological concepts thereof. Furthermore, various combinations and selections of various disclosed elements (including respective elements of the respective claims, respective elements of the respective exemplary embodiments, respective elements of the respective drawings, and the like) are possible within the scope of the claims of the present invention. That is, the present invention clearly includes every type of transformation and modification that a person skilled in the art can realize according to the entire disclosure including the scope of the claims and to technological concepts thereof. In particular, with regard to numerical ranges described in the present specification, arbitrary numerical values or small ranges included in the relevant ranges should be interpreted to be specifically described even where there is no particular description thereof.

What is claimed is:

1. A device comprising:
   an output circuit;
   a DLL (Delay Locked Loop) circuit comprising a first delay line receiving a first clock signal and outputting, in response to receiving the clock signal, a second clock signal supplied to the output circuit; and
   an ODT (On Die Termination) circuit receiving an ODT activation signal and outputting, in response to receiving the ODT activation signal, an ODT output signal supplied to the output circuit to set the output circuit in a resistance termination state, and
   the ODT circuit comprising a second delay line configured to be set by the DLL circuit in an equivalent delay amount that is equivalent to a delay amount of the first delay line, the ODT output signal being, in a first time-period during which the ODT activation signal is in an active state, generated by being conveyed via the second delay line in which the equivalent delay amount has been set.

2. The device according to claim 1, wherein
   the DLL circuit is activated, during a second time-period before the first time-period, to set the equivalent delay amount in the first and second delay lines.

3. The device according to claim 1, wherein
   the DLL circuit is inactivated during the first time-period.

4. The device according to claim 1, comprising:
   a DLL activation delay circuit generating, from a DLL activation signal indicating whether or not the DLL circuit is to be activated, a delay DLL activation signal that is delayed from the DLL activation signal, and outputting the delay DLL activation signal to the DLL circuit.

5. The device according to claim 1, wherein the ODT circuit comprising:
   an output replica circuit coupled to the second delay line and simulating a same operation as the output circuit.

6. The device according to claim 4, wherein
   the DLL circuit is inactivated in accordance with the delay DLL activation signal outputted by the DLL activation delay circuit during a third time-period included in the first time-period, and is activated in accordance with the delay DLL activation signal outputted by the DLL activation delay circuit during a fourth time-period after the third time-period included in the first time-period.

7. The device according to claim 5, comprising:
   a latch circuit latching the ODT output signal according to the second clock signal.

8. The device according to claim 5, wherein the latch circuit latches the ODT signal according to the second clock signal outputted by the DLL circuit that is activated during the fourth time-period.

9. A device comprising:
   an output circuit to be supplied with an ODT (On Die Termination) output signal;
   a delay circuit configured to be set in a delay amount by an ODT control unit; and
   a delay line replica circuit configured to be free from being set in a delay amount by the ODT control unit and coupled between the delay circuit and the output circuit, and the ODT output signal being generated by being conveyed via the delay circuit and the delay replica circuit to set the output circuit in a resistance termination state.

10. The device according to claim 9, comprising:
a DLL (Delay Locked Loop) delay line circuit configured to be free from being set in a delay amount by the ODT control unit.

11. The device according to claim 10, wherein
the delay line replica circuit and the DLL delay line circuit are configured to set in a same delay amount as each other.

12. The device according to claim 10, comprising:
a DLL activation delay circuit coupled to the DLL delay line circuit and outputting a delay DLL activation signal to the DLL delay line circuit.

13. The device according to claim 9, comprising:
an output replica circuit coupled to the delay line replica circuit and simulating a same operation as the output circuit.

14. The device according to claim 9, comprising:
a counter circuit coupled between the ODT control unit and the delay circuit and setting the delay amount of the delay circuit in response to a control signal produced by the ODT control unit.

15. The device according to claim 9, comprising:
a latch circuit inserted between the delay line replica circuit and the output circuit and latching the ODT output signal in response to a clock signal provided by a DLL (Delay Locked Loop) delay line circuit.

16. A method comprising:
setting a first delay amount of a DLL (Delay Locked Loop) delay line circuit of a DLL circuit when the DLL circuit is activated; and
setting a second delay amount of a DLL delay replica circuit when the DLL circuit is activated, and the settings of the first and second delay amounts being concurrent so that the first and second delay amounts are a same as each other.

17. The method according to claim 16 comprising:
setting a third delay amount of a ODT (On Die Termination) delay circuit, the setting of the third delay amount being independently of the settings of the first and second amounts.

18. The method according to claim 17 comprising:
outputting a shift output signal by the ODT circuit that has been set in the third delay amount;
producing an ODT output signal by conveying the shift output signal via the DLL delay replica circuit has been set in the second delay amount.

19. The method according to claim 18, comprising:
activating an ODT circuit comprising the ODT replica circuit to produce the ODT output signal; and
keeping deactivating the DLL circuit during the activating of the ODT circuit.

20. The method according to claim 18, comprising:
activating an ODT circuit comprising the ODT replica circuit to produce the ODT output signal; and
changing from deactivating the DLL circuit to activating the DLL circuit during the activating of the ODT circuit.

* * * * *